United States Patent [19]

van de Plassche

[11] Patent Number: 4,831,379
[45] Date of Patent: May 16, 1989

[54] COMPLEMENTARY VOLTAGE INTERPOLATION CIRCUIT

[75] Inventor: Rudy J. van de Plassche, Cupertino, Calif.

[73] Assignee: North American Philips Corporation, Signetics Division, Sunnyvale, Calif.

[21] Appl. No.: 96,793

[22] Filed: Sep. 14, 1987

Related U.S. Application Data

[63] Continuation of Ser. No. 809,453, Dec. 16, 1985, abandoned.

[51] Int. Cl.$^4$ .............................................. H03M 1/14
[52] U.S. Cl. .................................... 341/156; 341/159; 341/162
[58] Field of Search ................ 341/156, 159, 162, 169

[56] References Cited

U.S. PATENT DOCUMENTS 4,733,217  3/1988  Dingwall .......................... 341/156

Primary Examiner—William M. Shoop, Jr.
Assistant Examiner—Gary J. Romano
Attorney, Agent, or Firm—R. Meetin; D. Treacy; T. Briody

[57] ABSTRACT

The invention centers around a system for interpolating between multiple pairs of main complementary signals to generate further pairs of complementary signals. An input circuit (10) supplies the main signals. The interpolation is done with two strings (12) of a selected number of impedance elements ($R_0$-$R_{N-1}$ and $R_{N0}$-$R_{NN-1}$). Each pair of main signals is supplied to a corresponding pair of nodes along the strings. The interpolated signals are taken from other pairs of corresponding nodes along the strings. The interpolation system is particularly suitable for use in an analog-to-digital converter of the folding type.

23 Claims, 4 Drawing Sheets

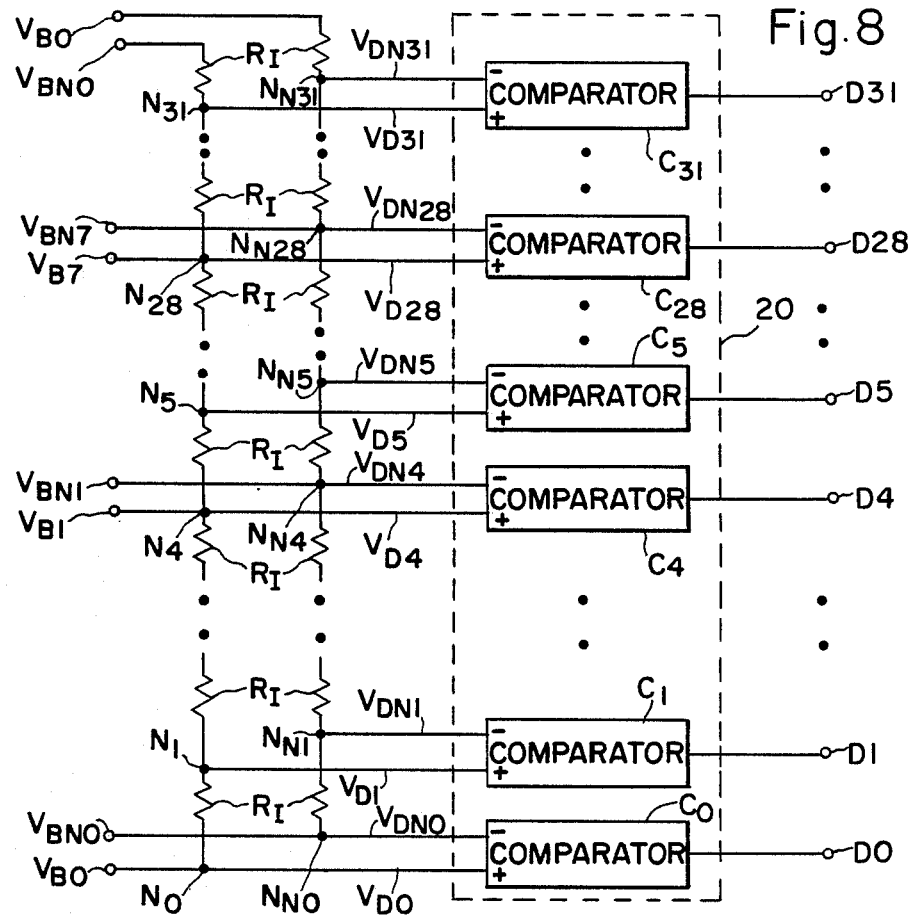
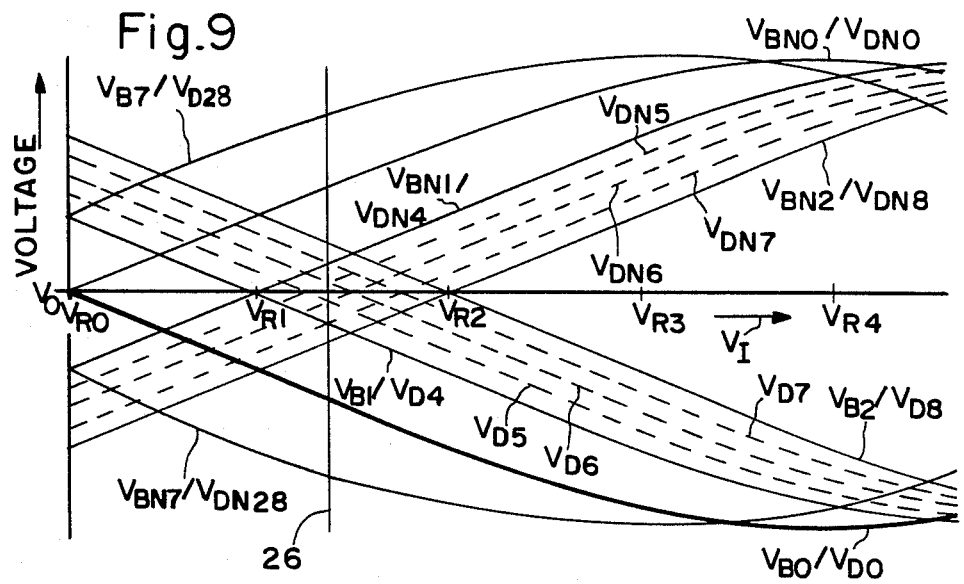

COMPLEMENTARY VOLTAGE INTERPOLATION CIRCUIT

This is a continuation of U.S. patent application Ser. No. 809,453 filed Dec. 16, 1985, now abandoned.

FIELD OF USE

This invention relates to electronic circuits suitable for use in devices such as analog-to-digital (A/D) converters.

BACKGROUND ART

Important considerations in designing an A/D converter are speed, component count, and resolution. Flash converters provide the greatest speed. To convert an analog input voltage into an n-bit digital output code, a flash converter usually has $2^n - 1$ input comparators that compare the input voltage with $2^n - 1$ corresponding reference voltages supplied from a resistive voltage divider. For example, see J. Peterson, "A Monolithic Video A/D Converter", *IEEE JSSC*, Dec. 1979, pp. 932-937.

The principal disadvantage of the flash converter is a high component count due to the large number of input comparators. A large chip area is needed to implement the device in integrated circuit form. Numerous schemes have been proposed to cut the number of comparators. For example, see U.S. Pat. Nos. 4,270,118 and 4,386,339. These schemes normally accept a loss in conversion speed as a compromise.

A "folding" system is one of the more promising techniques for reducing component count. In a folding A/D converter, a set of input amplifiers respond to the input voltage and a corresponding set of reference voltages in such a way as to generate one or more pairs of complementary waveforms that have a repetitive rounded triangular shape as a function of the input voltage. A group of fine comparators convert these sawtooth waveforms into a string of bits which are encoded into the least significant bits of the output code. The most significant bits are supplied from a group of coarse comparators which operate on the input voltage along a separate channel from the folding array. See R. van de Plassche et al, "A High-Speed 7 Bit A/D Converter," *IEEE JSSC*, Dec. 1979, pp. 938-943. Also see R. van de Grift et al, "A Monolithic 8-Bit Video A/D Converter," *IEEE JSSC*, June 1984, pp. 374-378.

The chip area for a folding converter is reduced dramatically because it utilizes considerably fewer comparators than an otherwise equivalent flash converter. While folding systems do offer relatively good speed with low power dissipation, the inherent "rounding off" of the tips of the repetitive triangular waveforms must be taken into account to avoid loss in resolution. It is highly desirable to have a simple technique that takes maximum advantage of the linear portions of these waveforms.

GENERAL DISCLOSURE OF THE INVENTION

The central feature of this invention is a system for interpolating between multiple pairs of complementary signals that vary with a parameter to generate further pairs of complementary signals representing the parameter.

More particularly, an input circuit provides a plurality of pairs of substantially complementary main signals. The signals are normally generated in response to an analog input voltage in such a manner that the voltages of at least one of the signal pairs vary in a non-insubstantial manner as a function of the input voltage for each value of the input voltage as it varies across an input voltage range. The main signals are therefore linear (i.e., non-digital) in nature.

The interpolation is performed with two strings of a selected number of corresponding impedance elements, preferably resistors. A node is located between each pair of consecutive impedance elements in each string, at one end of one of the strings, and at the corresponding end of the other string. The nodes fall into pairs located in the same respective positions along the strings. Some of the nodes are input nodes. Others are interpolation nodes so distributed among the input nodes that at least one interpolation node lies between the two most distant input nodes in each string. Each pair of corresponding input nodes receives a different one of the pairs of main signals. Each pair of corresponding interpolation nodes provides a pair of interpolated signals.

The voltage at each interpolation node is the interpolation of the voltages at the two nearest input nodes on opposite sides of the interpolation node. Each impedance element in one string preferably has largely the same impedance as the corresponding impedance element in the other string. The interpolated signals at each pair of corresponding interpolation nodes are therefore substantially complementary to each other.

While the present interpolation system has wide applicability, it is particularly useful in a folding-type A/D converter. The main signals are repetitive rounded triangular waveforms provided from a folding array in the converter. The output signals from the interpolation circuitry consist of the interpolated signal pairs as well as the main signal pairs. A group of comparators generates a string of digital bits by comparing the voltages of each output signal pair.

The magnitudes of the voltage differences are not important in these comparisons. Only the "zero crossings"—i.e., the signs of the voltage differences—are material. The interpolation avoids difficulty involving the rounding off of the tips of the waveforms because their variation as a function of the input voltage is substantially linear in the vicinity of the zero crossings. Interpolating by a factor of 2–8 normally gives good resolution. The result is that component count is reduced without loss in speed or decrease in accuracy.

BRIEF DESCRIPTION OF THE DRAWINGS

FIG. 9 is a graph of the interpolated signals. Like reference signals are employed in the drawings and in the description of the preferred embodiments to represent the same or very similar item or items.

DESCRIPTION OF THE PREFERRED EMBODIMENTS

Figure 1:
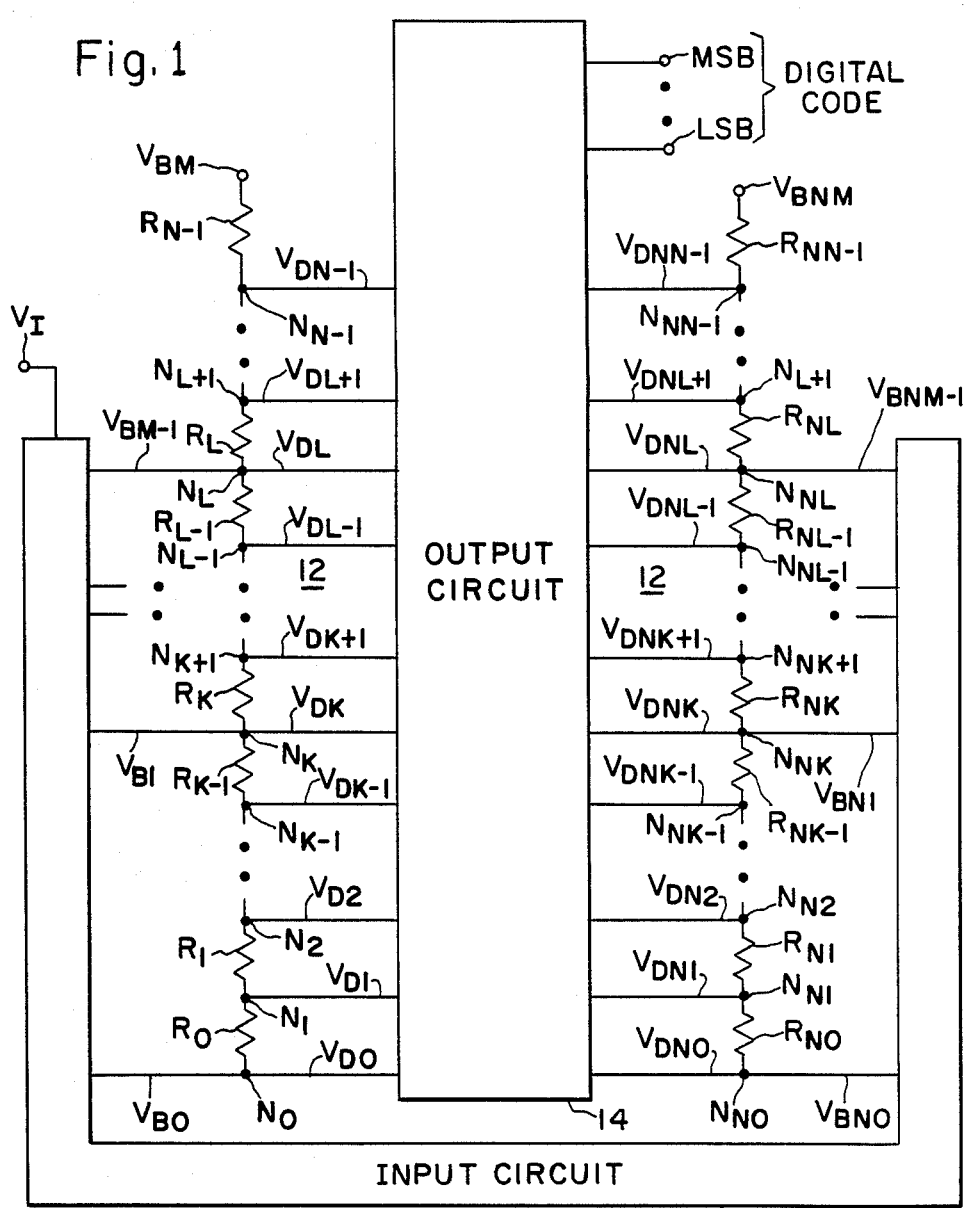
FIG. 1 is a circuit diagram of an embodiment of an interpolation system according to the invention.

Referring to the drawings, FIG. 1 illustrates a circuit for interpolating between the voltage levels of M+1 main signals $V_{B0}$, $V_{B1}$, ... $V_{BM}$ and M+1 further main signals $V_{BN0}$, $V_{BN1}$, ... $V_{BNM}$. These 2M+2 voltages are often referred to collectively as the "$V_B$" signals. M is at least 1. The signals of each pair of like-numbered $V_B$ signals are substantially complementary to each other. That is, each voltage $V_{BNj}$ is largely the electrical inverse of corresponding voltage $V_{Bj}$, where j runs from 0 to M.

An input circuit 10 provides complementary signal pairs $V_{B0}$ and $V_{BN0}$–$V_{BM-1}$ and $V_{BNM-1}$ in response to a parameter $V_I$ which is typically an analog input voltage. In one way or another, circuit 10 also generates voltages $V_{BM}$ and $V_{BNM}$. They may be distinct from the other $V_B$ signals. If there are repetitive transitions in the $V_B$ signals, voltages $V_{BM}$ and $V_{BNM}$ may respectively be voltages $V_{B0}$ and $V_{BN0}$ or vice versa to provide "interpolation around the corners".

Figure 2:
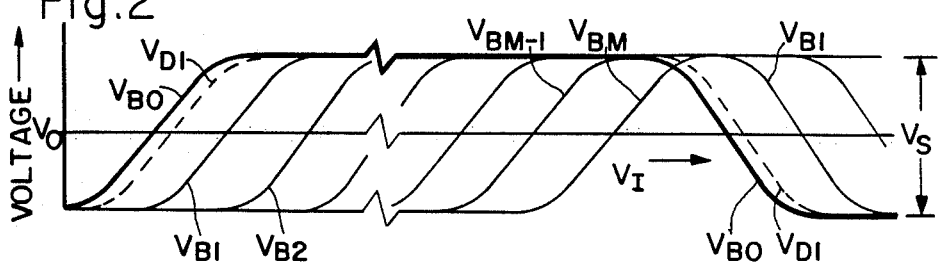
FIG. 2 is a graph of signals that can be interpolated by the system of FIG. 1.

The $V_B$ signals have voltage characteristics of the type generally indicated in FIG. 2. For simplicity, FIG. 2 only shows the waveforms for $V_{B0}$–$V_{BM}$. The VBO waveform is shown in thicker line. If the waveforms for $V_{BN0}$–$V_{BNM}$ as a function of $V_I$ were illustrated, they would respectively be the inverses of the waveforms for $V_{B0}$–$V_{BM}$.

The $V_B$ signals are spaced apart from one another as a function of $V_I$. They all vary across substantially the same voltage range whose magnitude is indicated as $V_S$. A consecutive pair of the $V_B$ signals consists of voltages $V_{Bj-1}$ and $V_{Bj}$ or $V_{BNj-1}$ and $V_{BNj}$. The $V_B$ signals are numbered in such a way that the higher-numbered voltage $V_{Bj}$ or $V_{BNj}$ of each consecutive pair makes transitions between its extreme voltage levels at a greater $V_I$ value than the lower-numbered voltage $V_{Bj-1}$ or $V_{BNj-1}$.

At a given value of $V_I$, the voltage difference between any two consecutive $V_B$ signals is less than $V_S$ whenever at least one of them is changing with $V_I$. That is, the transition regions for two In this manner, the $V_B$ signals are all "linear" signals. The zero-crossing point is at a voltage $V_O$ approximately half way between the minimum and maximum $V_B$ levels.

FIG. 2 shows that the $V_B$ waveforms are very similar to one another. This is desirable, although not essential to the invention. If the $V_B$ waveforms have the shapes illustrated in FIG. 2, the voltage difference between any two consecutive $V_B$ signals at a given $V_I$ value is ideally about $V_S/2$ when both are changing with $V_I$.

Returning to FIG. 1, an interpolation circuit 12 generates interpolated signals whose voltages lie between the voltages of each pair of consecutive $V_B$ signals. Circuit 12 consists of a string of N interpolation resistors $R_0$, $R_1$, ... $R_{N-1}$ and a further string of N interpolation resistors $R_{N0}$, $R_{N1}$ ... $R_{NN-1}$. Letting q be an integer running from 0 to N-1, each pair of corresponding resistors $R_q$ and $R_{Nq}$ have substantially the same resistance.

A node $N_q$ lies between each pair of consecutive resistors $R_{q-1}$ and $R_q$. A corresponding node NNq similarly lies between each pair of consecutive resistors $R_{Nq-1}$ and $R_{Nq}$. In addition, corresponding nodes $N_O$ and $N_{NO}$ exist at the ends of the strings where resistors $R_O$ and $R_{NO}$ are respectively located. Some of the pairs of corresponding nodes are input nodes. The remainder are interpolation nodes. At least one interpolation node lies between the two most distant input nodes along each string.

Corresponding input signals $V_{Bj}$ and $V_{BNj}$ are respectively supplied to the particular input nodes located in the same relative position among the pairs of input nodes along the resistor strings that the voltage pair $V_{Bj}$ and $V_{BNj}$ have in the sequence of $V_B$ signals. In particular, input nodes $N_O$ and $N_{NO}$ respectively receive voltages $V_{BO}$ and $V_{BNO}$. Letting K and L be selected integers in the range from 2 to N (where L is greater than K), FIG. 1 shows that the next input node pair $N_K$ and $N_{NK}$ receives the next pair $V_{BI}$ and $V_{BNI}$ and that input node pair $N_L$ and $N_{NL}$ receives pair $V_{BM-1}$ and $V_{BNM-1}$. Voltages $V_{BM}$ and $V_{BNM}$ are respectively supplied to terminals at the ends of the string where resistors $R_{N-1}$ and $R_{NN-1}$ are located. These terminals are additional input nodes if voltages $V_{BM}$ and $V_{BNM}$ are distinct from the other $V_B$ signals.

Each pair of corresponding interpolation nodes provides a pair of corresponding interpolated signals that are substantially complementary to each other. For example, FIG. 1 indicates that interpolation node pairs $N_1$ and $N_{N1}$, $N_2$ and $N_{N2}$, ... $N_{K-1}$ and $N_{NK-1}$ respectively provide K-1 interpolated signal pairs $V_{D1}$ and $V_{DN1}$, $V_{D2}$ and $V_{DN2}$, ... $V_{DK-1}$ and $V_{DNK-1}$. The dashed line in FIG. 2 depicts a typical shape for $V_{D1}$.

For convenience in illustration, the "B" subscript in each of $V_{BO}$–$V_{BM-1}$ and $V_{BNO}$–$V_{BNM-1}$ is changed to "D" after these signals pass through the resistor strings. The output signals from circuit 12 therefore consist of N signal pairs $V_{DO}$ and $V_{DNO}$–$V_{DN-1}$ and $V_{DNN-1}$. These are often referred to collectively as the $V_D$ signals, of which N-M pairs are the interpolated signal pairs and the remaining M pairs are the main signal pairs. Each voltage $V_{DNq}$ is the inverse of voltage $V_{Dq}$.

The difference in input voltage $V_I$ at the zero crossings for any two consecutive $V_B$ signals is normally the same for all the pairs of consecutive $V_B$ signals. The resistors are usually spaced out in equal numbers among the input nodes (including the $V_{BM}$ and $V_{BNM}$ terminals) along the strings. As a result, the $V_D$ zero crossings are spaced out in equal increments as a function of $V_I$.

An output circuit 14 receives the $V_D$ signals and operates on them in some way. FIG. 1 shows, for example, that the $V_D$ signals are converted into a digital code.

Figure 3:
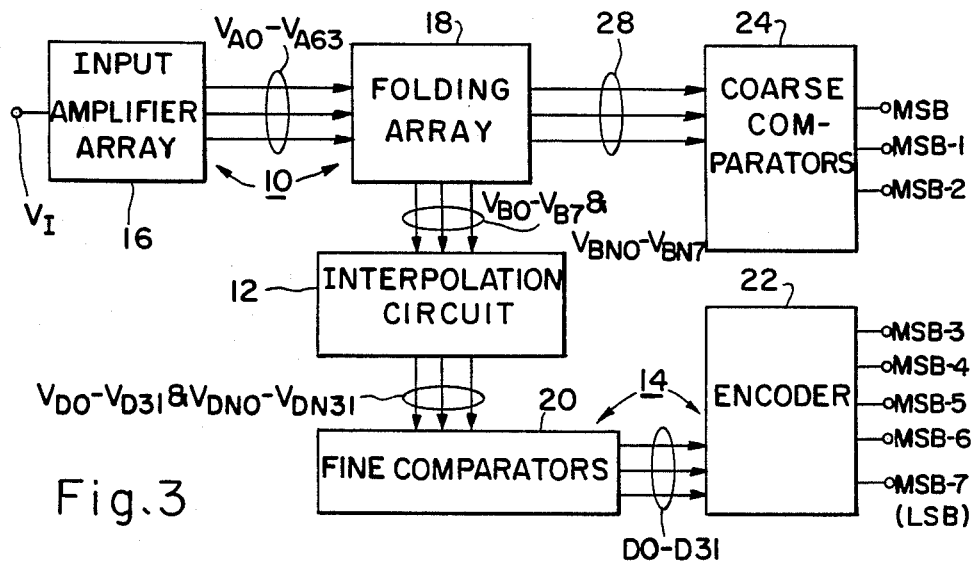
FIG. 3 is a general block diagram of a folding A/D converter using the interpolation system of FIG. 1.

FIG. 3 illustrates an application of the present interpolation system to an 8-bit A/D converter of the multiple folding type. Input circuit 10 of FIG. 1 here consists of an input amplifier array 16 and a folding array 18. Output circuit 14 of FIG. 1 consists of a group 20 of fine comparators and an encoder 22. The converter also has a group 24 of coarse comparators.

Figure 4:
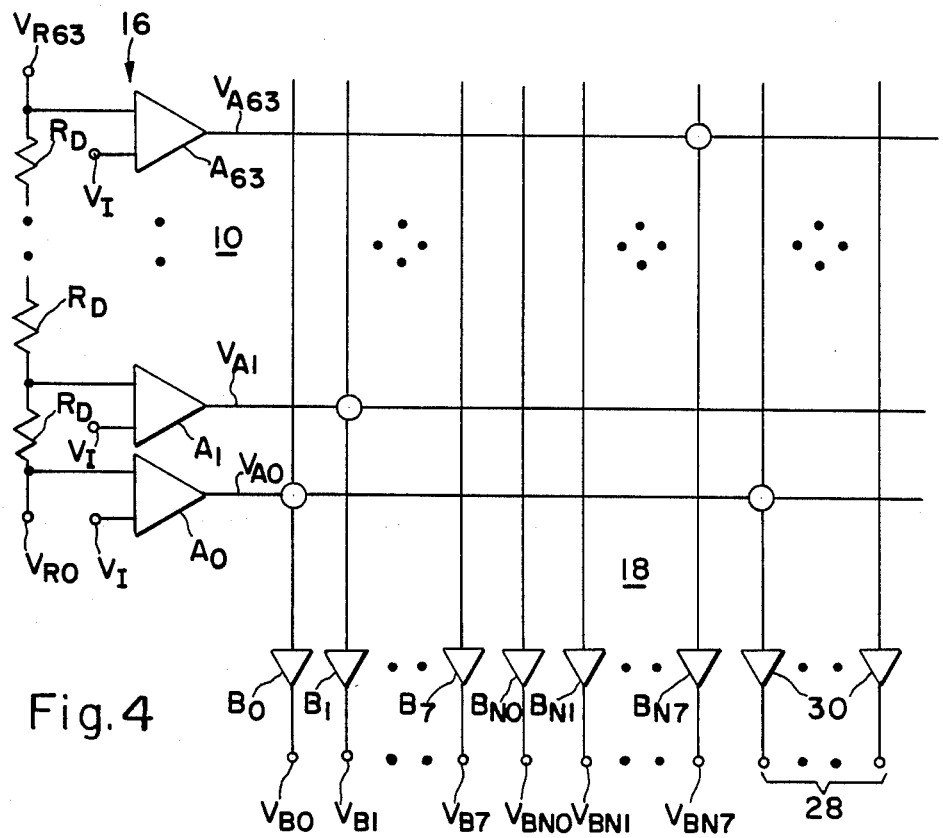
FIG. 4 is a circuit diagram of the input circuit of FIG. 3.

Turning to FIG. 4, it shows details of arrays 16 and 18. Amplifier array 16 contains 64 input amplifiers $A_0$–$A_{63}$ arranged in 8 rows by 8 columns. Letting i be an integer running from 0 to 63, each amplifier $A_i$ amplifies the difference between analog input voltage $V_I$ and a corresponding reference voltage $V_{Ri}$ to produce an amplified output voltage $V_{Ai}$. Voltages $V_{R0}$–$V_{R63}$ are supplied from a resistive divider consisting of 63 equal-value resistors $R_D$ connected between low and high reference voltages $V_{R0}$ and $V_{R63}$.

Figure 5:
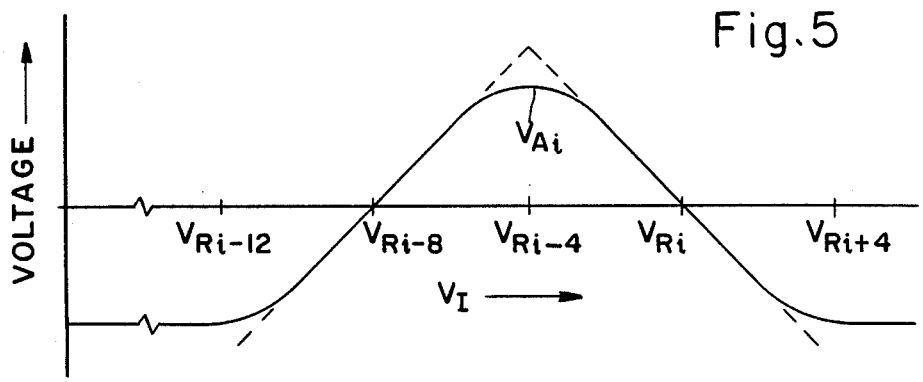
FIG. 5 is a graph of the output voltage from a typical input amplifier in FIG. 4.

FIG. 5 illustrates the general shape for typical voltage $V_{Ai}$ as a function of $V_I$. Signal $V_{Ai}$ would ideally have the triangular shape shown in dashed line. Due to practical amplifier characteristics, voltage $V_{Ai}$ actually has the more rounded shape indicated in solid line.

Figure 6:
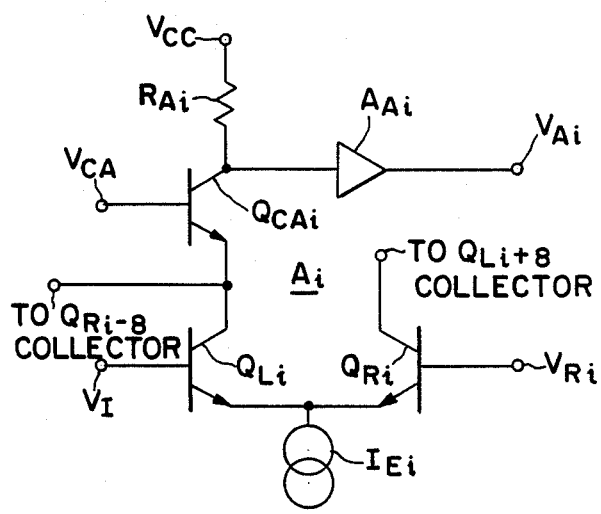
FIG. 6 is a circuit diagram of this amplifier.

The internal configuration for typical amplifier $A_i$ is depicted in FIG. 6. Voltages $V_I$ and $V_{Ri}$ are respectively supplied to the bases of identical NPN transistors $Q_{Li}$ and $Q_{Ri}$ whose emitters are connected together and to a current source $I_{Ei}$. The $Q_{Li}$ collector is connected to the emitter of an NPN cascode transistor $Q_{CAi}$ whose base receives a common cascode bias voltage $V_{CA}$. A load resistor $R_{Ai}$ is connected between a source of a high supply voltage $V_{CC}$ and the collector of transistor $Q_{CAi}$. Its collector is further connected to the input of a buffer amplifier $A_{Ai}$ whose output provides voltage $V_{Ai}$. Importantly, the collectors of transistors $Q_{Li}$ and $Q_{Ri}$ are respectively connected to the collectors of transistor $Q_{Ri-8}$ and $Q_{Li+8}$ in amplifiers $A_{i-8}$ and $A_{i+8}$.

Amplifier $A_i$ operates in a differential manner in conjunction with amplifier $A_{i-8}$. When $V_I$ equals $V_{Ri}$, the differential pair $Q_{Li}$ an $Q_{Ri}$ is balanced so that $V_{Ai}$ has a zero crossing. The differential pair $Q_{Li-8}$ and $Q_{Ri-8}$ in amplifier $A_{i-8}$ is balanced when $V_I$ equals $V_{Ri-8}$. Due to the collector coupling to transistor $Q_{Ri-8}$, $V_{Ai}$ has another zero crossing at that point. The result is that $V_{Ai}$ reaches a maximum voltage when $V_I$ equals $V_{Ri-4}$ and is constant at a minimum voltage when $V_I$ is less than $V_{Ri-12}$ or greater than $V_{Ri+4}$. The interaction with amplifier $A_{i+8}$ controls signal $V_{Ai+8}$ in the same way.

Another group of input amplifiers provide the requisite low-end interactions with lower-row amplifiers $A_0-A_7$ to enable their signals $V_{A0}-V_{A7}$ to have largely the same shape as typical signal $V_{Ai}$. Also, some further signals of the $V_{Ai}$ type are needed to provide the necessary shapes for certain of the $V_B$ signals at the upper end of the $V_I$ input range (i.e., near $V_{R63}$). These further signals are supplied from a group of input amplifiers that interact with upper-row amplifiers $A_{56}-A_{63}$. The various additional amplifiers are not indicated in the drawings but are generally similar to amplifier $A_i$.

Folding array 18 electrically combines every sixteenth intermediate signal $V_{Ai}$ to produce 16 voltages $V_{B0}-V_{B7}$ and $V_{BN0}-V_{BN7}$. These signals are respectively supplied from the outputs of 16 buffer amplifiers $B_0-B_7$ and $B_{N0}-B_{N7}$ whose inputs are selectively coupled to the outputs of the desired $A_i$ amplifiers. The circles in FIG. 4 represent the couplings.

Figure 7:
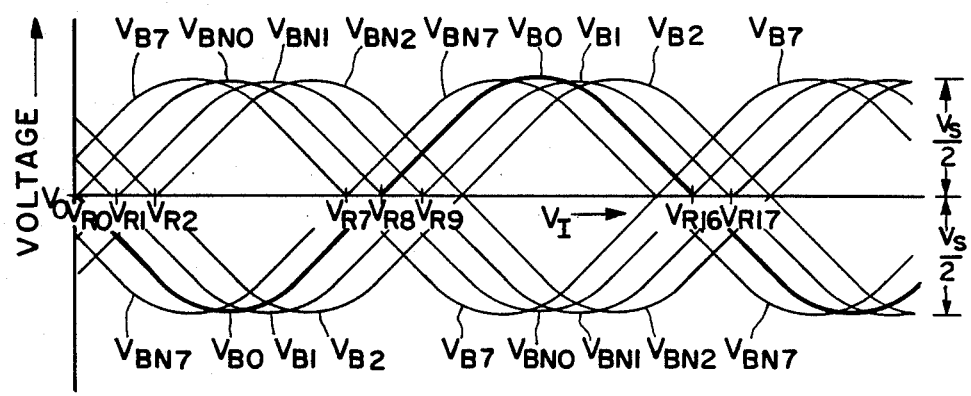
FIG. 7 is a graph of signals interpolated by the system of FIG. 8 which is a circuit diagram of the interpolation/output circuitry of FIG. 3.

FIG. 7 depicts part of the resulting $V_B$ signals as a function of $V_I$. Again, $V_{B0}$ is shown in thicker line. The remaining $V_B$ signals have the same shapes and spacing as those illustrated. Due to the rounding of the tips of the $V_{Ai}$ signals, each $V_B$ signal in FIG. 7 has a repetitive rounded triangular shape, almost that of a sine wave. The $V_B$ signals make repetitive transitions between their extreme levels as $V_I$ varies across the input range extending from $V_{R0}$ to $V_{R63}$. The repetition interval is $16\Delta V_R$ where $\Delta V_R$ is the voltage across any resistor $R_D$.

Moving to FIG. 8, it illustrates details for interpolation circuit 12 and fine comparators 20. Signals $V_{BM}$ and $V_{BNM}$ in circuit 12 of FIG. 1 respectively are signals $V_{BN0}$ and $V_{B0}$ in FIG. 8. The two resistor strings essentially become a ring of resistors. This enables the interpolation to extend over all the $V_B$ cycles as $V_I$ ranges from $V_{R0}$ to $V_{R63}$.

The resistors, which are labeled as $R_I$, all have the same value. Four resistors $R_I$ lie between each pair of consecutive input nodes. Accordingly, circuit 12 interpolates by a factor of 4 between each consecutive pair of $V_B$ signals to generate 64 voltages $V_{D0}-V_{D31}$ and $V_{DN0}-V_{DN31}$.

Comparator group 20 consists of 32 master-slave flip-flops $C_0-C_{31}$. Each comparator $C_q$ compares complementary signals $V_{Dq}$ and $V_{DNq}$ to generate a digital bit $D_q$. The magnitudes of voltages $V_{Dq}$ and $V_{DNq}$ are not important, only whether there is a zero crossing—i.e., whether their difference is positive or negative. Bit $D_q$ is a logical "1" (for example) if $V_{Dq}$ is greater than $V_{DNq}$ and vice versa.

A sample of the interpolation is illustrated in FIG. 9. It shows how interpolated voltages $V_{D5}-V_{D7}$ are equally spaced between input voltages $V_{B1}/V_{D4}$ and $V_{B2}/V_{D8}$. Complementary pair $V_{B1}$ and $V_{BN1}$ have a zero crossing when $V_I$ equals $V_{R1}$. Pair $V_{B1}$ and $V_{BN2}$ have a zero crossing at $V_{R2}$. Consider what happens if $V_I$ has a value between $V_{R1}$ and $V_{R2}$ as, for example, represented by line 26 in FIG. 9. Comparators 20 would provide bits D4, D5, D6, D7, and D8 as "00111". The bits resulting from the interpolated signals—i.e., the intermediate 3 bits "011" in this example—provide a finer digital conversion than that available solely from the $V_B$ signals.

The ability of the interpolation to provide accurate representation of input voltage $V_I$ is determined by the slopes of the interpolated signals in the vicinity of zero-crossing voltage $V_O$. The $V_B$ signals vary in a substantially linear manner near $V_O$. That is, their slopes are largely constant as a function of $V_I$ in the vicinity of $V_O$. The $V_B$ signals also have substantially the same slope near $V_O$. Since consecutive $V_B$ signals partially overlap one another as a function of $V_I$, the interpolated signals vary in a substantially linear manner near $V_O$ and have largely the same slope there.

The $V_D$ signals (including both the main and interpolated signals) do vary in a non-linear manner near their extreme voltage levels. However, only the zero crossings are material to comparators 2. They provide accurate resolution if there is a sufficiently wide region around $V_O$ in which the interpolated signals have substantially the same, constant slope. The non-linear regions do not significantly affect the accuracy. By suitably choosing the amount that the $V_B$ signals overlap one another, the combination of circuits 12 and 20 provides high resolution without necessitating an excessive number of $V_B$ signals.

The minimum interpolation is a factor of 2. For typical parameters, interpolation by a factor of 8 normally yields good resolution.

Returning to FIG. 3, encoder 22 encodes the string of 32 bits D0–D31 into the five least significant bits MSB-3—MSB-7 of a digital output code. Encoder 22 is a suitably programmed read-only memory that operates on the bit string in a conventional manner.

Coarse comparators 24 consist of three master-slave flip-flops that respectively provide the three most significant bits MSB—MSB-2 of the digital output code in response to three respective pairs of substantially complementary further signals 28. The A/D converter generates signals 28 in largely the same manner as the $V_B$ signals. For convenience, FIG. 3 shows that folding array 18 provides signals 28. With reference to FIG. 4, voltages 28 are supplied from corresponding buffer amplifiers 30 whose inputs are coupled to selected ones of the $A_i$ outputs. However, the waveforms for signals 28 do not have the repetitive folding shape of the $V_B$ signals.

One of comparators 24 supplies the most significant bit MSB by comparing (a) the signal formed by combining voltages $V_{A0}$, $V_{A4}$, $V_{A8}$, ... $V_{A28}$, and $V_{A32}$ with (b) the complementary signal formed by combining voltages $V_{A40}$, $V_{A44}$, ... $V_{A60}$. Another compares (a) the signal formed by combining voltages $V_{A0}$, $V_{A4}$, $V_{A8}$, $V_{A12}$, $V_{A16}$, $V_{A40}$, $V_{A44}$, and $V_{A48}$ with (b) the complement of this signal to generate the second most significant bit MSB-1. The voltages from certain of the additional input amplifiers not indicated in the drawings are also combined into the input signals to the MSB and MSB-1 comparators in order to attain continuity "around the.. corners". The last of comparators 24 generates MSB-2 in a similar way.

Methods for manufacturing the various elements of the present invention are well known in the semiconductor art. The A/D converter is preferably fabricated in monolithic integrated circuit form using oxide isolation to separate active regions in a semiconductor wafer.

The present A/D converter occupies significantly less chip area than an otherwise comparable 8-bit flash converter. While circuits 12, 18, and 20 take about the same area as the encoding circuitry of the flash converter, the number of transistor in a comparator is several times that in each amplifier $A_i$. Consequently, the chip area is typically reduced by a factor of around three. The instant converter also has low input capacitance and low power consumption.

While the invention has been described with reference to particular embodiments, this description is solely for the purpose of illustration and is not to be construed as limiting the scope of the invention claimed below. For example, the input amplifiers could be arranged in four rows by sixteen columns or vice versa. Thus, various changes, modifications, and applications may be made by those skilled in the art without departing from the true scope and spirit of the invention as defined by the appended claims.

I claim:

1. An electronic circuit having input means responsive to an input parameter for providing multiple pairs of substantially complementary main signals of which each varies with the input parameter as it varies; characterized by interpolation means comprising two strings of a selected number of impedance elements in which: a node is located between each pair of consecutive impedance elements in each string, at one end of one string, and at a corresponding end of the other string; the pairs of nodes located at like positions along the strings comprise pairs of corresponding input nodes and pairs of corresponding interpolation nodes, whereby at least one of the input nodes lies between the ends of each string; at least one of the interpolation nodes is located between the two most distant input nodes in each string; each pair of corresponding input nodes receives a different one of the pairs of main signals; and each pair of corresponding interpolation nodes provides a pair of corresponding interpolated signals.

2. A circuit as in claim 1 characterized in that each impedance element in one of the strings has largely the same impedance as the like-positioned impedance element in the other string, the signals of each pair of corresponding interpolated signals being substantially complementary to each other.

3. A circuit as in claim 2 characterized in that each impedance element is a resistor.

4. A circuit as in claim 2 characterized in that the aforementioned end of each string is connected to the other end of that string or to the other end of the other string.

5. A circuit as in claim 4 characterized in that: each string has at least three input nodes; and each pair of consecutive input nodes is separated by the same number of impedance elements along each string.

6. A circuit as in claim 2 characterized in that: each string has at least three input nodes; and the number of impedance elements is equal to or greater than twice the number of main signals, at least one of the interpolation nodes lying between each pair of consecutive input nodes along each string.

7. A circuit as in claim 6 characterized in that each pair of consecutive input nodes is separated by the same number of impedance elements along each string.

8. A circuit as in claim 7 characterized in that the number of impedance elements separating each pair of consecutive input nodes along each string is in the range from 2 to 8.

9. A circuit as in claim 8 characterized in that each impedance element is a resistor.

10. A circuit as in claim 2 wherein the input parameter is an analog input voltage, characterized in that at least one of the pairs of main signals varies in a non-insubstantial manner as a function of the input voltage for each value of the input voltage as it varies across an input voltage range.

11. A circuit as in claim 10 characterized in that the main and interpolated signals all vary across substantially the same signal voltage range.

12. A circuit as in claim 11 characterized in that: each string has at least three input nodes; and the voltage difference between any two main signals at consecutive input nodes along each string at a given value of the input voltage is less than the magnitude $V_S$ of the signal voltage range when at least one of the two signals is changing with the input voltage at the given value.

13. A circuit as in claim 12 characterized in that the foregoing voltage difference is optimally $V_S/2$ when the two signals are both varying with the input voltage at the given value.

14. A circuit as in claim 13 characterized in that each impedance element is a resistor.

15. A circuit as in claim 2 characterized by output means for converting the main and interpolated signals into a digital code.

16. A circuit as in claim 15 characterized in that the output means comprises a group of comparators, each providing a digital bit in response to a different one of the pairs of corresponding main and interpolated signals.

17. A circuit as in claim 15 characterized in that the input means comprises: means for providing a plurality of reference voltages spaced across an input voltage range; means responsive to an input voltage that varies across the input voltage range for generating a plurality of intermediate voltages respectively corresponding to the reference voltages and cumulatively representative of the input voltage, the waveform for each intermediate voltage as a function of the input voltage being of a rounded triangular shape, with an extreme value occurring when the input voltage differs slightly from the corresponding reference voltage; and means for combining selected ones of the intermediate voltages to produce the main signals.

18. An electronic circuit for converting an analog input voltage which varies across an input voltage range into a digital code consisting of a set of most significant bits and a set of least significant bits, there being: means for supplying the most significant bits; means for providing a plurality of reference voltages spaced across the input voltage range; means responsive to the input and reference voltages for generating pairs of substantially complementary main signals, the voltage waveform for each main signal as a function of the input voltage being of a repetitive rounded triangular shape; and means for operating on the main signals to produce the least significant bits; characterized in that:

the means for generating comprises: means for producing a like plurality of intermediate voltages respectively corresponding to the reference voltages and cumulatively representative of the input voltage, the waveform for each intermediate voltage as a function of the input voltage being of a rounded triangular shape with an extreme value occurring when the input voltage is slightly different from the corresponding reference voltage; and means for combining selected ones of the intermediate voltages to produce the main signals; and the means for supplying comprises: further means for combining selected ones of the intermediate voltages to produce pairs of substantially complementary further signals; and a group of coarse comparators, each providing a different one of the most significant bits by comparing the signals of a corresponding pair of the further signals.

19. A circuit as in claim 18 characterized in that the means for operating comprises:

interpolation means comprising two strings of a selected number of impedance elements in which (1) a node is located between each pair of consecutive impedance elements in each string, at one end of one string, and at a corresponding end of the other string, (2) the pairs of nodes located at like positions along the strings comprise pairs of corresponding input nodes and pairs of corresponding interpolation nodes with at least one of the interpolation nodes located between the two most distant input nodes in either string, (3) each pair of corresponding input nodes receives a different one of the pairs of main signals, and (4) each pair of corresponding interpolation nodes provides a pair of substantially complementary interpolated signals; and means for converting the main and interpolated signals into the least significant bits.

20. A circuit as in claim 19 characterized in that the means for converting comprises:

a group of fine comparators, each providing a digital output signal by comparing the signals of a different one of the pairs of main and interpolated signals; and means for encoding the digital signals to generate the least significant bits.

21. An electronic circuit comprising:

input means responsive to an input parameter for providing multiple pairs of substantially complementary main signals, each of which varies with the input parameter as it varies;

two strings of a like number of resistors in which (1) a node is located between each pair of consecutive resistors in each string, at one end of one string, and at a corresponding end of the other string, (2) the pairs of nodes located at like positions along the strings comprise pairs of corresponding input nodes and pairs of corresponding interpolation nodes, whereby at least one of the input nodes lies between the ends of each string, (3) at least one of the interpolation nodes lies between each pair of consecutive input nodes along each string, and (4) each resistor in one string has largely the same resistance as the like-positioned resistor in the other string; and means connecting the input means to the strings to provide each pair of corresponding input nodes with a different one of the pairs of main signals, each pair of corresponding interpolation nodes thereby providing a pair of substantially complementary interpolated signals.

22. A circuit as in claim 21 wherein the input means comprises:

means for providing a plurality of reference voltages spaced across an input voltage range, the input parameter being an input voltage that varies across the input voltage range;

means responsive to the input voltage for generating a plurality of intermediate voltages respectively corresponding to the reference voltages and cumulatively representative of the input voltage, the waveform for each intermediate voltage as a function of the input voltage being of a rounded triangular shape with an extreme value occurring when the input voltage differs slightly from the corresponding reference voltage; and means for combining selected ones of the intermediate voltages to produce the main signals.

23. A circuit as in claim 22 further including output means for converting the main and interpolated signals into a digital code.

* * * * *